United States Patent [19]

Bailey et al.

[11] Patent Number: 5,470,661
[45] Date of Patent: Nov. 28, 1995

[54] DIAMOND-LIKE CARBON FILMS FROM A HYDROCARBON HELIUM PLASMA

[75] Inventors: Fredric D. Bailey, Golden, Colo.; Douglas A. Buchanan, Cortlandt Manor, N.Y.; Alessandro C. Callegari; Howard M. Clearfield, both of Yorktown Heights, N.Y.; Fuad E. Doany, Katonah, N.Y.; Donis G. Flagello, Ridgefield, Conn.; Harold J. Hovel, Katonah, N.Y.; Douglas C. Latulipe, Jr., Danbury, Conn.; Naftali E. Lustig, Croton-on-Hudson, N.Y.; Andrew T. S. Pomerene, New Fairfield, Conn.; Sampath Purushothaman, Yorktown Heights, N.Y.; Christopher M. Scherpereel, Poughquag, N.Y.; David E. Seeger, Congers, N.Y.; Jane M. Shaw, Ridgefield, Conn.

[73] Assignee: International Business Machines Corporation, Armonk, N.Y.

[21] Appl. No.: 1,374

[22] Filed: Jan. 7, 1993

[51] Int. Cl.$^6$ ........................................ B24B 3/02
[52] U.S. Cl. ........................ 428/408; 423/446; 428/699
[58] Field of Search ................................ 428/408, 699; 423/446; 427/249

[56] References Cited

U.S. PATENT DOCUMENTS

| | | | |
|---|---|---|---|
| 4,486,286 | 12/1984 | Lewin et al. | 204/192 C |
| 4,603,082 | 7/1986 | Zelez | 428/408 |
| 4,663,183 | 5/1987 | Ovshinsky et al. | 427/39 |
| 4,698,256 | 10/1987 | Giglia et al. | 428/408 |
| 4,717,622 | 1/1988 | Kurokawa et al. | 428/405 |
| 4,728,529 | 3/1988 | Etzkorn et al. | 427/39 |
| 4,777,090 | 10/1988 | Ovshinsky et al. | 428/408 |
| 4,783,361 | 11/1988 | Ovshinsky et al. | 428/217 |
| 4,783,368 | 11/1988 | Yamamoto et al. | 428/408 |
| 4,849,290 | 7/1989 | Faymori et al. | 428/408 |
| 4,900,628 | 2/1990 | Ikegaya et al. | 428/408 |
| 4,915,977 | 4/1990 | Okamoto et al. | 427/37 |
| 4,935,303 | 6/1990 | Ikoma et al. | 428/408 |
| 4,961,958 | 10/1990 | Desphandey et al. | 427/38 |
| 5,190,807 | 3/1993 | Kimock et al. | 428/216 |

OTHER PUBLICATIONS

Lou et al "Low temperature diamond deposition by microwave plasma enhanced chemical vapor deposition" Appl. Phys. Lett 55(7): 8–14–89 pp. 631–633.

Williams et al "Characterization of diamond thin films: Diamond phase identification surface morphology and defect structures" J. Mates Res vol. 4, No. 2, 3/4 89 pp. 373–384.

Ma et al "Selective nucleation and growth of diamond particles by plasma–assisted chemical Selective nucleation and growth of dimaond particles by plasma–assisted chemical vapor deposition" Appl. Phys. Lett. vol. 53 No. 19 Nov. 7,1988 pp. 1071–1073.

Matsumoto et al "Chemical Vapor Deposition of Diamond From Methane–Hydrogen gas" Proc 7th ICVM, 1982, Tokyo, Japan pp. 386–391.

Aisenberg, et al. "Ion–Beam Deposition of Thin Films of Diamondlike Carbon," *Journal of Appl. PHys.* 42, pp. 2953–2958 (1971).

(List continued on next page.)

*Primary Examiner*—Archene Turner
*Attorney, Agent, or Firm*—Scully, Scott, Murphy & Presser

[57] ABSTRACT

The present invention relates to an improved method of depositing a diamond-like carbon film onto a substrate by low temperature plasma-enhanced chemical vapor deposition (PECVD) from a hydrocarbon/helium plasma. More specifically, the diamond like carbon films of the present invention are deposited onto the substrate by employing acetylene which is heavily diluted with helium as the plasma gas. The films formed using the process of the present invention are characterized as being amorphous and having dielectric strengths comparable to those normally observed for diamond films. More importantly, however is that the films produced herein are thermally stable, optically transparent, absorbent in the ultraviolet range and hard thus making them extremely desirable for a wide variety of applications.

7 Claims, 10 Drawing Sheets

OTHER PUBLICATIONS

Callegari, et al. "Properties of $SiO_2$/Si/GaAs structures formed by solid phase epitaxy of amorphous Si on GaAs", *Appl. Phys. Lett.* 58, pp. 2540–2542 (1991).

Collins, "The Electronic and Optical Properties of Diamond; Do they Favour Device Applications?" *Mat. Res. Soc. Symp. Proc.* 162, pp. 3–13 (1990).

Grill, et al. "Diamondlike carbon films by rf plasma–assisted chemical vapor deposition from acetylene", *IBM J. Res. Develop.* 34, pp. 849–857 (1990).

Batey, et al. "Plasma–Enhanced CVD of High Quality Insulating Films", *Appl. Surface Sci.* 39, pp. 1–15 (1989).

Yamagami, et al. "A New Anti–reflective Layer for Deep UV Lithography", *Microlithograph*, Paper 1674–28, Session 8.

Grill, et al. "Optical and tribological properties of heat–treated diamond–like carbon", *J. Mater. Res.* 5, pp. 2531–2537 (1990).

Grill "Inhomogeneous carbon bonding in hydrogenated amorphous carbon films", *J. Appl. Phys.* 61, pp. 2874–2877 (1987).

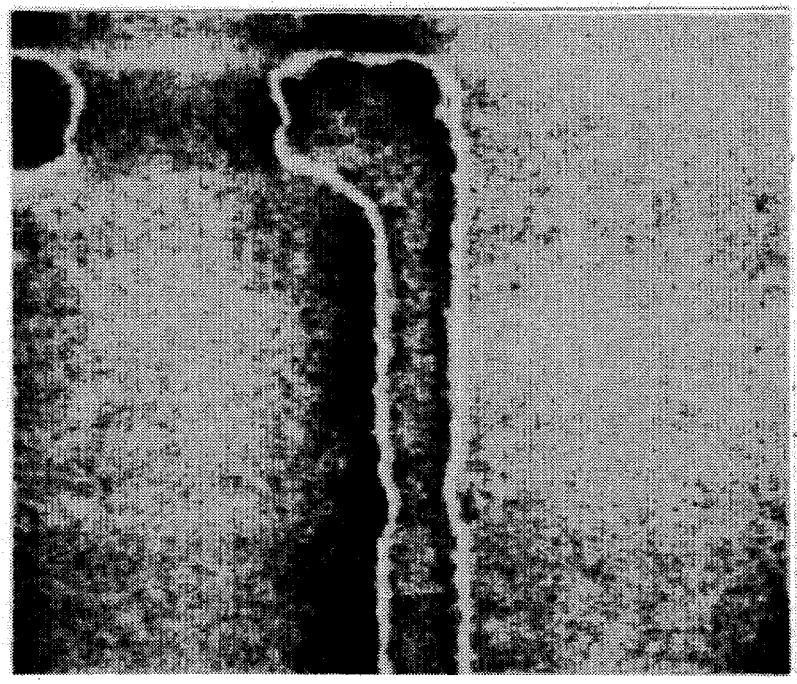
FIG. 8(a) No ARC
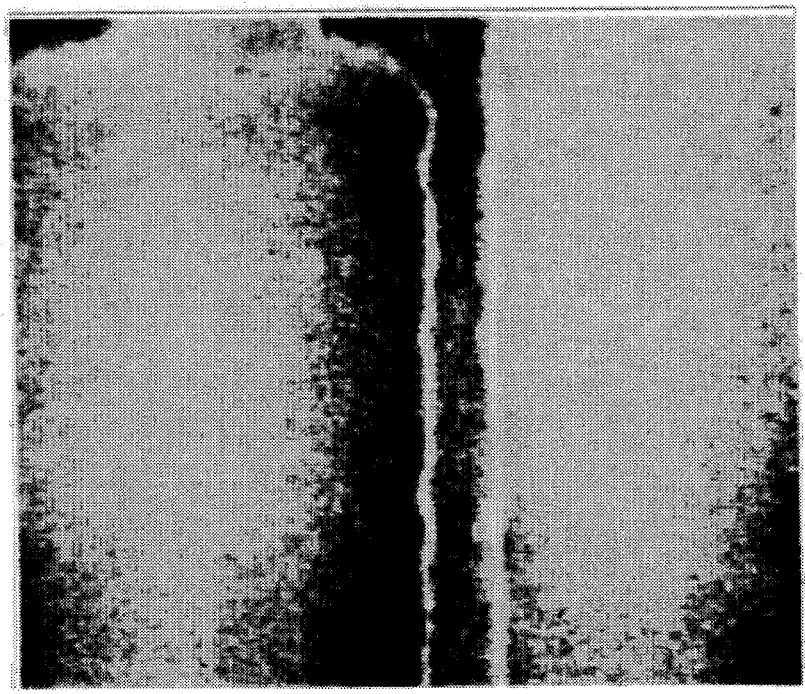
FIG. 8(b) Polymer ARC

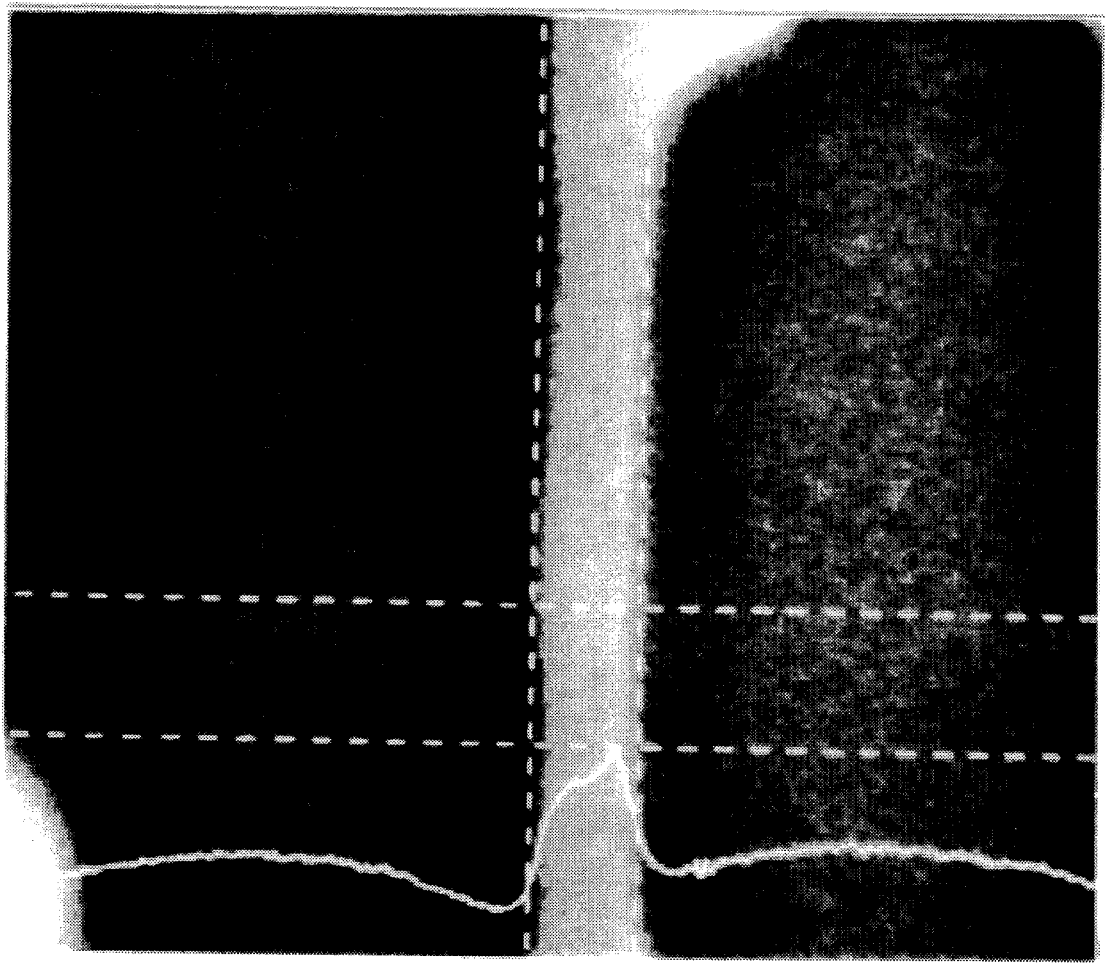
FIG.8(c) CVD Carbon ARC

DIAMOND-LIKE CARBON FILMS FROM A HYDROCARBON HELIUM PLASMA

TECHNICAL FIELD

The present invention relates to an improved method of plasma-enhanced chemical vapor deposition (PECVD) for depositing diamond-like carbon films from a hydrocarbon/helium plasma, preferably an acetylene/helium plasma. The films produced by the present invention are characterized as being thermally stable, optically transparent, hard and amorphous. Such films displaying these physical properties are extremely useful as deep ultraviolet (UV) antireflective coatings. Moreover, the films produced by the present invention are useful as a scratch resistant and UV inhibiting coating for plastic materials, such as lenses. Additionally, since the amorphous films are etchable in oxygen reactive ion etch processes, the films can readily be etched to form an absorber for a deep UV conventional or phase shift mask.

PRIOR ART

Hydrogenated amorphous carbon (a-C:H) films, also called diamond-like carbon (DLC) films because of their hardness, have drawn a lot of attention because of their potential use in coatings and semiconductor devices. For these films to be useful in chip process technology or in hostile thermal and mechanical environments, increased thermal stability at high temperatures is necessary.

Diamond-like carbon films are defined as metastable, amorphous material which may contain a microcrystalline phase. Diamond-like carbon films are differentiated from diamond layers, which are fabricated by using plasma-based or hot-filament deposition since the diamond layers are polycrystalline material with crystallites up to tens of microns in size. The diamond-like carbon films were first deposited by Aisenberg, et al., J. Appl. Phys. 42, 2953 (1971). Since this first initial investigation of depositing diamond-like carbon films, a variety of different techniques such as dc or rf plasma-assisted carbon vapor deposition, sputtering, and ion-beam sputtering have been utilized. Furthermore, a variety of different carbon-bearing source materials, i.e. solid or gaseous, have also been used in an attempt to provide an improved on diamond-like carbon film However, these techniques are unable to provide a high quality film which exhibits high thermal stability, adjustable optical transparency and improved hardness. Thus, research is ongoing in attempt to develop an improved method of depositing amorphous diamond-like carbon films onto a substrate such that the films have the hereinabove mentioned properties.

One such method of depositing diamond-like carbon films on a substrate is disclosed in U.S. Pat. No. 4,486,286 to Lewin et al. The reference relates to a method for depositing a diamond-like carbon film on a substrate by providing a source of carbon ions. These carbon ions are directed to the surface of the substrate, such as an optical lens, to form a film. Moreover, the carbon ions are produced by a glow discharge by employing at least one hydrocarbon gas and at least one other gas which removes graphite from the substrate film by chemical sputtering. The reference preferably uses a $C_2H_2/CO_2/Ar$ gas mixture or any combination of the three to deposit the diamond-like carbon film. It is well known in the art that films deposited using a $C_2H_2/Ar$ gas mixture are not thermally stable above 400° C. and therefore the films are quite limited in their application.

U.S. Pat. No. 4,663,183 to Ovshinsky et al. discloses a method of forming a hard, carbonaceous film on a substrate. The film is formed by decomposing a gaseous hydrocarbon having carbon atoms tetrahedrally coordinated to carbon nearest neighbors through carbon-carbon single bonds. Suitable gaseous hydrocarbons used in the process are x,x-dialkyls such as 2,2-dimethyl propane. The gaseous hydrocarbons are decomposed in a radio frequency maintained plasma. The film is said to be extremely useful as an antireflective coating on a photosensitive semi-conductor.

U.S. Pat. No. 4,717,622 to Kurokawa et al. relates to an rf plasma method for depositing amorphous diamond films in a $CH_4/Ar$ mixture. The deposition system employed in this process is a plasma injection chemical vapor deposition (CVD) technique. As mentioned previously hereinabove, the use of Ar as a gas component in CVD oftentimes results in a film which is not thermally stable above temperatures exceeding 400° C. Thus, the film formed from this technique is very limited in its commercial application.

U.S. Pat. No. 4,728,529 to Etzkorn et al. provides a diamond-like, transparent, clear and uncolored carbon coating with low internal stresses. The coating is generated on substrates using plasma discharge from a hydrocarbon gas or a mixture of hydrocarbon gas and pure hydrogen. The preferred gas mixture comprises $C_2H_2/Ar/H_2$. The problem associated with this particular method is that the film obtained contains a high concentration of hydrogen. A high concentration of hydrogen in the film results in a decrease in the thermal stability of the coated article. Thus, films containing a high concentration of hydrogen are extremely limited in their overall use.

U.S. Pat. No. 4,915,977 to Okamoto et al. relates to a method of depositing a diamond film on a substrate by dc sputtering carbon from a carbon target while keeping a dc plasma at the substrate. The dc sputtering is conducted in any combination of inert gases (such as Ar and Ne), $H_2$, and hydrocarbons at a temperature of several hundred degrees celsius.

U.S. Pat. No. 4,961,958 to Desphandey et al. relates to a process and apparatus for depositing diamond films on a substrate. The process basically comprises evaporating carbon in a $H_2$ or $CH_4/H_2$ plasma atmosphere while maintaining the temperature of the substrate between 20°–600° C. The advantage of using this particular technique is that one is said to be able to control the plasma volume chemistry independent of the source and substrate reaction, making it possible to obtain high deposition rates and also better control over the film properties.

Despite the numerous methods available in the art, there is still a continual need to provide a diamond-like carbon film that is thermally stable at temperatures exceeding 600° C. Such a film possessing high thermal stability would have high marketability and would be exceptionally useful in providing a coating for substrates such as magnetic heads where improved wear and corrosion resistance is required. Other potential applications for films exhibiting high thermal stability include coatings for electronic chips, electronic circuit boards and semiconductor devices. Furthermore, as indicated hereinabove films produced by prior art processes using $H_2$ and/or Ar as the plasma gas are oftentimes not stable at temperatures above 400° C., making them extremely limited in there commercial use.

The present invention is directed to an improved method of plasma-enhanced chemical vapor deposition of diamond-like carbon films onto a substrate from a hydrocarbon/helium plasma. Moreover, the films produced by PECVD using He rather than Ar as a diluent are thermally stable at temperatures exceeding 590° C. Since the films have a strong absorption in the deep UV they can be used as an antireflective coating (ARC). Due to their thermal stability the films can be left on chips or easily removed by $O_2$ RIE depending on the application. Furthermore, the diamond-like carbon films produced in accordance with the present invention are extremely useful as a scratch resistant and UV inhibiting coating for plastic lenses. Additionally, the films are etchable in oxygen RIE, thus finding application as a mask material for use in the fabrication of semiconductor devices.

SUMMARY OF THE INVENTION

The present invention relates to an improved method of depositing diamond-like carbon films onto a substrate by low temperature plasma-enhanced chemical vapor deposition (PECVD) from a hydrocarbon/helium plasma. More specifically, the diamond-like carbon films are deposited onto the substrate by employing acetylene which is heavily diluted with helium as the plasma gas. The films formed using the process of the present invention are characterized as being amorphous and having dielectric strengths comparable to those normally observed for diamond films. More importantly, however, the films produced herein are thermally stable, strongly absorbing in the deep UV, optically transparent and hard thus making them extremely desirable for a wide variety of applications.

The diamond-like carbon films of the present invention are useful as an ultraviolet (UV) antireflective coating. Another potential use of the films is as a scratch resistant and UV inhibiting coating for plastic materials, such as lenses or goggles. Additionally, the films formed by the present invention are readily etched in oxygen reactive ion etching processes therefore they are also useful for forming a deep UV conventional or phase shift mask for semiconductor devices. Another potential application for the diamond-like carbon films produced by the present process is the passivation and sealing of microelectronic packaging parts, making them more robust to corrosion and wear.

These and other aspects of the present invention are achieved by providing a method for depositing a diamond-like carbon film onto a substrate by PECVD which comprises the steps of: admixing a gas of a hydrocarbon and helium; providing a plasma chamber containing the substrate; and introducing the hydrocarbon/helium gas mixture into the chamber to deposit the film onto the substrate. More specifically, the present invention provides a method of depositing a diamond-like carbon film by using a gas mixture which comprises acetylene heavily diluted with helium. By employing this method, the diamond-like carbon film produced is thermally stable at temperatures above 590° C. and the film is characterized as being hard, amorphous and optically transparent. Furthermore, the present invention relates to the coated substrate produced by the process of the present invention.

BRIEF DESCRIPTION OF THE DRAWINGS

FIGS. 5(a) and 5(b) demonstrate the I–V characteristics of an amorphous carbon film/Si heterojunction, wherein FIG. 5(a) represents an $n^-$ and $p^-$ type Si heterojunction and FIG. 5(b) represents an $n^+$ and $p^+$ Si heterojunction.

FIG. 8 is a photograph showing the differences between patterning with 8(a) no ARC, 8(b) a spin on ARC, 8(c) an amorphous diamond-like carbon film ARC.

DESCRIPTION OF THE PREFERRED EMBODIMENT

The present invention relates to an improved method of producing extremely high quality hard amorphous diamond-like carbon films with the dielectric strength comparable to diamond by employing a low temperature plasma enhanced chemical vapor deposition from a hydrocarbon diluted in helium. The properties of the films produced by the present invention are vastly superior to those of plasma enhanced chemical vapor deposition films deposited from hydrocarbons which are either undiluted or diluted with other gases such as Ar, $H_2$, etc. Thus, materials coated with the diamond-like carbon films of the present invention are extremely useful in a wide variety of applications.

Figure 1:
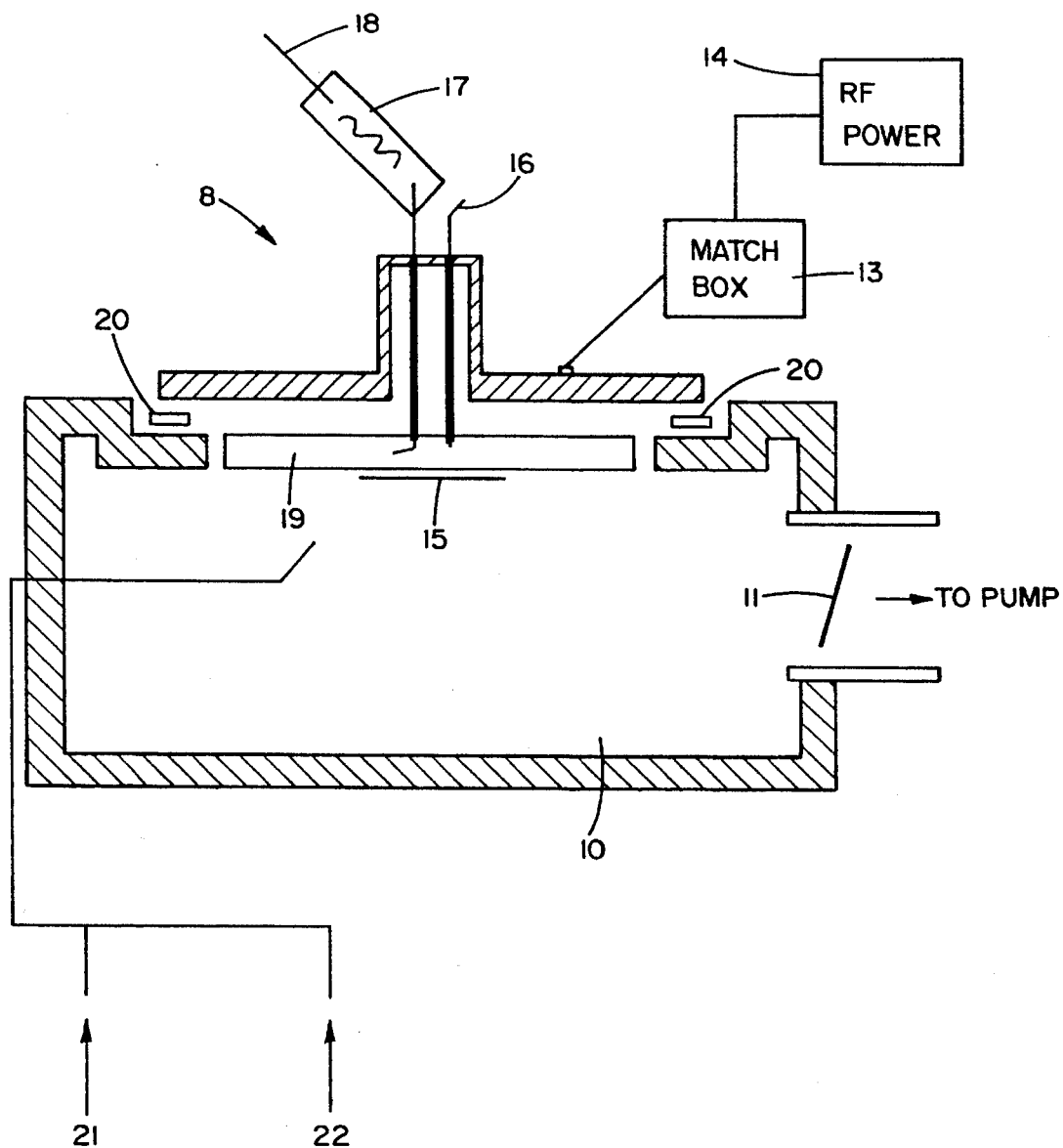
FIG. 1 is a schematic diagram of the plasma-enhanced chemical vapor deposition apparatus used for depositing the amorphous diamond-like carbon film of the present invention.

FIG. 1 is a diagram of a plasma enhanced chemical vapor deposition (PECVD) apparatus 8 that can be used to deposit the diamond-like carbon film of the present invention. The apparatus includes a reactor chamber 10 having a throttle valve 11 which separates the reactor chamber 10 from a vacuum pump not shown. A cathode 19 is mounted to the reactor chamber 10 and is isolated therefrom by a dielectric spacer 20. The cathode 19 is provided with a heater 17, an exhaust system 16 and sufficient means for allowing the inlet of $N_2$ gas 18. A substrate 15 is secured to the inner end of the cathode 19. As herein contemplated, the cathode is electrically connected to a radio frequency source 14 which may be regulated and the impedance between the cathode 19 and the radio frequency source 14 is matched by utilizing a match box 13.

The reactor chamber 10 also contains conduits 21 and 22 for introducing various materials into the reactor chamber 10. For example, the pre-mixed hydrocarbon helium gas mixture is introduced into the reactor chamber 10 through conduit 21 while Ar gas for cleaning the substrate is introduced through conduit 22.

The hydrocarbon gas which may be used in the present invention may be any hydrocarbon compound which is first capable of being gaseous and then able to form a plasma at the reaction condition employed by the present process. The term hydrocarbon implies that the molecules which make up the compound contains only carbon and hydrogen atoms. In accordance with one embodiment of the instant invention, saturated or unsaturated hydrocarbon compounds may be employed by the present process. By definition, a saturated hydrocarbon compound is a compound whose molecules contain only carbon single bonds while an unsaturated compound is a compound whose molecules contain carbon double or triple bonds. Suitable hydrocarbons contemplated by the present process include alkanes, alkenes and alkynes.

An alkane is defined herein as a compound whose molecules contain only single bonds between carbon atoms. Suitable alkanes which may be employed by the present process include compounds such as methane, ethane, propane, butane and the like thereof. Of these alkanes, methane is most particularly preferred.

Alkenes are defined herein as compounds whose molecules contain a carbon-carbon double bond. Alkene compounds which may be employed by the present process include compounds such as ethene, propene, n-butene and the like thereof.

An alkyne compound is defined herein as a hydrocarbon whose molecules contain a carbon-carbon triple bond. Suitable alkynes employed by the present process include acetylene, propylene, 1-butylene, 2-butylene and the like thereof. Of these alkynes, acetylene is most particularly preferred.

It is an especially preferred embodiment of the present invention that the preferred hydrocarbon gas which is employed in forming the diamond-like carbon film is acetylene. Additionally, it should be recognized that mixtures of hydrocarbon gases such as acetylene/methane may also be contemplated as the hydrocarbon gas of the present invention.

In order to obtain a film with high thermal stability, the hydrocarbon gas utilized in the instant invention is heavily diluted with helium. The term heavily diluted is defined herein as an admixture of a hydrocarbon with helium such that the final concentration of helium in the admixture constitutes from about 99 to about 50% of the gas mixture. More preferably, the hydrocarbon is diluted with helium such that the final concentration of hydrocarbon in the admixture is from about 2 to about 10%. Most preferably, the hydrocarbon constitutes about 2% of the overall gas mixture.

Gases employed by the present invention have a purity greater than about 95.5%. In a preferred embodiment, the gases have a purity in the range from about 98.5 to about 99.99%. Most preferably, the gases have a purity greater than 99.99%.

The high purity gases are pre-mixed in the same gas cylinder before being introduced in the reaction chamber. The gas mixture is introduced into the chamber by first passing it through a flow controller at a sufficient flow to provide a total pressure of hydrocarbon and helium from about 1 mTorr to about 600 mTorr. To provide the most effective diamond-like carbon film it is preferred that the pressure of hydrocarbon helium mixture be about 20–200 mTorr. The above conditions can also be obtained by introducing each gas separately through flow controllers providing the desired partial pressures.

Suitable substrates which may be coated with the diamond-like carbon film of the present invention include materials such as plastics; metals; various types of glass; magnetic heads; electronic chips; electronic circuit boards; semiconductor devices and the likes thereof. The substrate to be coated may be any shape or size provided that the substrate may be placed into the reaction chamber of the PECVD device. Thus, regular or irregular shape objects having any dimension may be used in the present invention.

The substrate is mounted on a rf cathode inside the reaction chamber of the PECVD device. The reaction chamber is then tightly sealed and evacuated until a pressure reading in the range of about $1 \times 10^{-4}$ to about $1 \times 10^{-7}$ Torr is obtained.

After evacuating the reaction chamber to the desired pressure range mentioned hereinabove, the substrate is then heated to a temperature from about 25° to 400° C. In a preferred embodiment of the present invention, the substrate is heated to a temperature from about 200° to 300° C. Most preferably, the substrate is heated to a temperature of about 270° C. prior to introducing the gas mixture into the reaction chamber. The temperature of the substrate is then held constant throughout the entire deposition process.

Depending on the type of substrate used, the material may or may not be subjected to in-situ plasma cleaning prior to depositing the diamond-like carbon film.

Suitable cleaning techniques employed by the present invention include $H_2$, Ar, $O_2$ and $N_2$ plasma sputter etching techniques.

After achieving and maintaining the desired temperature, the admixed gas is introduced into the reaction chamber at a flow of about 10 to about 100 sccm. More preferably, the flow rate of the reactant gas is from about 30 to about 80 sccm. Most preferably, the flow rate of the admixture of hydrocarbon and helium is about 50 sccm. The mixture is introduced into the reaction chamber at a pressure of about 1 to about 1000 m Torr. It is another preferred aspect of the instant invention that the admixture be introduced at a pressure of about 20 m Torr.

In order to obtain a plasma of the gas mixture, the cathode bias was held fixed at a voltage from about −90 to about −300 V throughout the deposition process. Most preferably, the cathode bias was maintained at −100 V throughout the experiment. This voltage is supplied to the rf cathode by using an rf choke-isolated dc power supply source. To minimize damage to the substrate material during the deposition process a low rf power density should be utilized. Typically this involves applying an rf power density from about 3 to about 10 mw/cm². More preferably, the rf power density employed by the present invention is maintained at 6 mw/cm² throughout the deposition process.

The diamond-like carbon film is deposited onto the substrate at a rate such that an essentially continuous coating of the film on the substrate is obtained. More specifically, by employing the previously mentioned operation parameters, the diamond-like carbon film is deposited onto the substrate at a rate of about 5 to 50 Å/min. The most preferred rate of depositing the diamond-like carbon film onto the substrate is at a rate about 20 Å/min.

In accordance with the present invention, the diamond-like carbon films deposited on the substrate are from about 100 to about 10,000 Å thick. More preferably, the thickness of the diamond-like carbon coating is from about 400 to about 2000 Å. It should be noted that by changing the resultant film thickness the optical density of the film can be changed. Thus, it is quite possible to tailor make a substrate with a defined optical density by merely increasing or decreasing the thickness of the film. The preferred optical densities of the diamond-like carbon films prepared by the present process are in the range from about 1 to about 3 at a wavelength of 248 nm which corresponds to a film thickness of about 1000 to about 3000 Å. After depositing the diamond-like carbon film onto the substrate, the coated material depending on its application may or may not be annealed. Annealing typically involves heating the substrate in an atmosphere of Ar/H$_2$ at 590° C. for a time period of about 3 to about 5 hours.

The diamond-like carbon film deposited in accordance with the process of the present invention are characterized as being amorphous, hard, thermally stable and optically transparent. Additionally, the diamond-like carbon films deposited by PECVD from a hydrocarbon/helium gas mixture have dielectric strength comparable to those normally associated with diamond films. The diamond-like carbon film deposited from a hydrocarbon/helium gas mixture in accordance with the present invention has a dielectric strength close to 10 MV/cm.

The diamond-like carbon films of the present invention also provide a substrate with an extremely hard protective coating. The films deposited by the instant invention have a Young modulus of about 213 GPa to about 278 GPa which corresponds to a hardness of about 22.8 GPa to about 38.4 GPa. The film hardness is measured herein by using a nanoindenter from Nano Instruments, Knoxville, Tenn.

As indicated previously, the diamond-like carbon films of the present invention formed on the substrate are also optically transparent. The films are optically transparent at wavelengths of about 450 to about 750 nm., preferably about 550 to about 750 nm. Films which are optically transparent are suitable for use as coatings for plastic lenses or goggles.

Of the characteristics listed hereinabove, of particular importance is that the diamond-like carbon films deposited by the instant invention are thermally stable at temperatures exceeding 590° C. This high thermal stability of the resultant diamond-like carbon films exceeds those values previously reported for PECVD using undiluted hydrocarbon or a hydrocarbon/Ar gas mixture. Without wishing to be bound by any mechanism, the improved thermal stability of the film obtained using a hydrocarbon/He gas mixture indicates that helium may play an important role in stabilizing the sp$^3$ coordination of the carbon atoms in the resultant film. Thus, thermal stability in this instance appears to be due to the properties of plasma excited helium. In a He-excited plasma energetic electrons are absorbed by the high energy metastable states at about 22 eV which is only about 2 eV below the ionization potential of He (24.46 eV). This makes it easier to maintain a plasma since the ionization takes place from the metastable states at a lower energy. This lowers the overall electron temperature of the plasma resulting in less energy available to produce multiple and gas phase nucleation. In contrast, Ar has low energy metastable states at about 12 eV (ionization potential of 15.6 eV) which cannot sufficiently remove the high energy electrons from the films. Thus, films formed from a hydrocarbon/At plasma are not thermally stable at temperatures above 400° C.

Additionally since the diamond-like carbon films of the present invention are exceptionally hard having the hereinabove defined Young's modulus and hardness, the film when applied to a plastic surface results in a coating that is highly scratch resistant and UV protective. Highly scratch resistant and UV inhibiting coatings are extremely important aspects which one must take into consideration when developing a coating for plastic lenses, goggles, car windows, etc.

Figure 2:
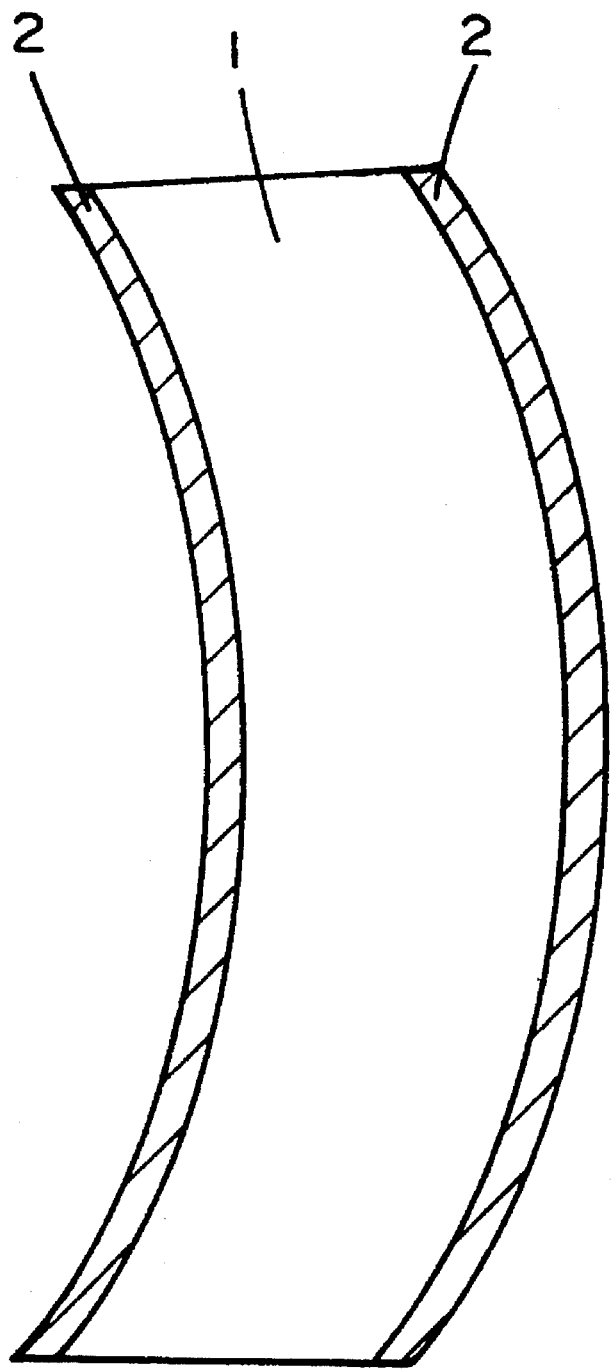
FIG. 2 is a cross-sectional diagram of a plastic lens coated with an amorphous diamond-like carbon film of the present invention.

FIG. 2 is a cross-sectional diagram of a plastic lens coated with an amorphous diamond-like carbon film of the present invention produced by PECVD from an acetylene/helium plasma. The plastic lens is made from a polymethylmethacrylate (PMMA) material (1) which is soft and easy to scratch. However, when the amorphous diamond-like carbon film (2) is deposited onto the surface of the plastic lens in accordance with the present invention, an improved scratch resistant coating is obtained. Furthermore, the plastic lens coated with the film of the instant invention provides improved UV protection over prior art films.

In accordance with another aspect of the present invention, the diamond-like carbon films act as a deep UV antireflective coating (ARC) which are needed to fabricate memory chips or other devices. Such coatings effectively reduce the reflectivity effects when exposing and patterning a single layer deep UV resist used in circuit fabrication on memory chips. Normally, an ARC is made of polymers spun on the wafer, however, this results in poor process control because the ARC material reacts with the photoresist (PR) degrading the ARC/PR interface. Furthermore, spin-on ARC are not suitable for coating fine lithographic features such as 0.5 μm (wide)×>1 μm (deep) trenches. The films formed by the present invention readily etch in oxygen plasma at a rate comparable to those of photoresists. Thus, the film when coated onto a memory chip may be easily removed by O$_2$ plasma treatments typically used for photoresist residue removal without damaging the photoresist profile. Furthermore, the index of refraction of the films is similar to that reported for organic photoresist thus reflections at the ARC/photoresist interface are minimized as opposed to inorganic ARC of higher index.

Furthermore, the diamond-like carbon films formed by the present invention may be used as an ideal absorber for deep UV photomasks. Such photomasks will be used as an alternative to chrome mask blanks which are commonly employed in the art. This process will eliminate all of the environmentally hazardous aspects of the chrome deposition, wet and RIE processes. Furthermore, the carbon masks containing the film of the present invention brings with it the high thermal conductivity of diamond as well as the hardness. Thus, these films can also be used as a direct patterned mask material and be ablated using a 193 nm laser in a reticle generation machine. The carbon photomask absorber having the film formed from an acetylene/helium plasma are etched at the same rate as photoresist in an oxygen plasma RIE thus eliminating the chrome wet etch and RIE process which produce toxic waste products thus, patterning the mask is a simpler and environmentally more acceptable process.

The carbon films of the present invention have a reflectivity of 13.5% at 248 nm as compared to antireflecting chrome at 27%. This nearly 2× difference will serve to reduce the unwanted flare reflected from the reticle/mask.

The carbon films as a photomask absorber can be deposited at a thickness of about 2000 Å which corresponds to an optical density of about 2.3. The films can also be used as an attenuated phase mask. In this application a film thickness of 1200 Å would be required for a π phase change.

The following examples are given to illustrate the scope of the present invention. Because these examples are given for illustrative purposes only, the invention embodied therein should not be limited thereto.

EXAMPLE I

The following example is given to illustrate the process of depositing a diamond-like carbon films onto a substrate by plasma-enhanced chemical vapor deposition from a hydrocarbon/helium gas mixture.

Experiments were carried out for depositing diamond-like carbon films on n$^-$, n$^+$, p$^-$ and p$^+$ Si substrates which were previously cleaned by employing a standard cleaning procedure outlined hereinbelow. The substrates were first dipped for five minutes at about 70° C. in ammonium hydroxide ($NH_4OH$), hydrogen peroxide ($H_2O_2$), DI water (1:1:5), then DI water rinsed to 18 megohm. Thereafter, the substrates were then dipped again for five minutes at about 70° C. in hydrogen chloride (HCL), hydrogen peroxide ($H_2O_2$), DI water (1:1:5) and again DI water rinsed to 18 megohm. The substrates were then etched for about 10 sec at room temp (until wafer is hydrophobic) in 10% HF in DI water or 9:1 BHF and DI water rinsed to 18 megohm. Finally they were blow dried with (filtered) nitrogen gas.

The Si substrates were then loaded on to the rf cathode of the PECVD device in FIG. 1. Thereafter, the system was evacuated to a partial pressure reading of about $1 \times 10^{-6}$ Torr. The substrates were then heated to a temperature of about 250° C. Upon obtaining the desired substrate temperature the amorphous diamond-like carbon films were deposited from a mixture of acetylene/helium at a pressure of about 20 mTorr. The gases employed by the present process have a purity of greater than about 99.99% and furthermore the admixture gas comprise 98% acetylene and 2% helium. To minimize plasma damage to the substrates, a rf power density of about 6 mW/$cm^2$ was utilized in this experiment. The admixture gas was introduced into the reactor chamber at a flow of about 50 sccm. The rf plasma was ignited such that a negative cathode self-bias of −100 V was maintained throughout the process. The diamond-like carbon was deposited onto the substrates at a rate of about 18 Å/min. The process was stopped after a film thickness of about 900 Å was obtained.

COMPARATIVE EXAMPLE A

The following comparative example illustrates the importance of utilizing an acetylene/helium gas mixture in providing a diamond-like carbon film with improved thermal stability. Diamond-like carbon films in this example were deposited in accordance with the procedure described in Example 1 however the admixture contained an acetylene/Ar (2% Ar) mixture.

It should be noted that the hydrogen content is a key parameter in defining the film properties because the hardness of the film is attributed to the formation of $sp^3$ bonds which contain at least 1,2 or even 3 hydrogen atoms. The poor thermal stability of PECVD amorphous films is attributed to H loss leading to the formation of dehydrogenated $sp^2$ bonds (graphite) after thermal stress. Thus, the H content for the Ar- and He-PECVD process before and after thermal stress by forward recoil detection (FRD) were measured. This technique gives a direct measurement of the number of H atoms contained in the film.

Figure 3:
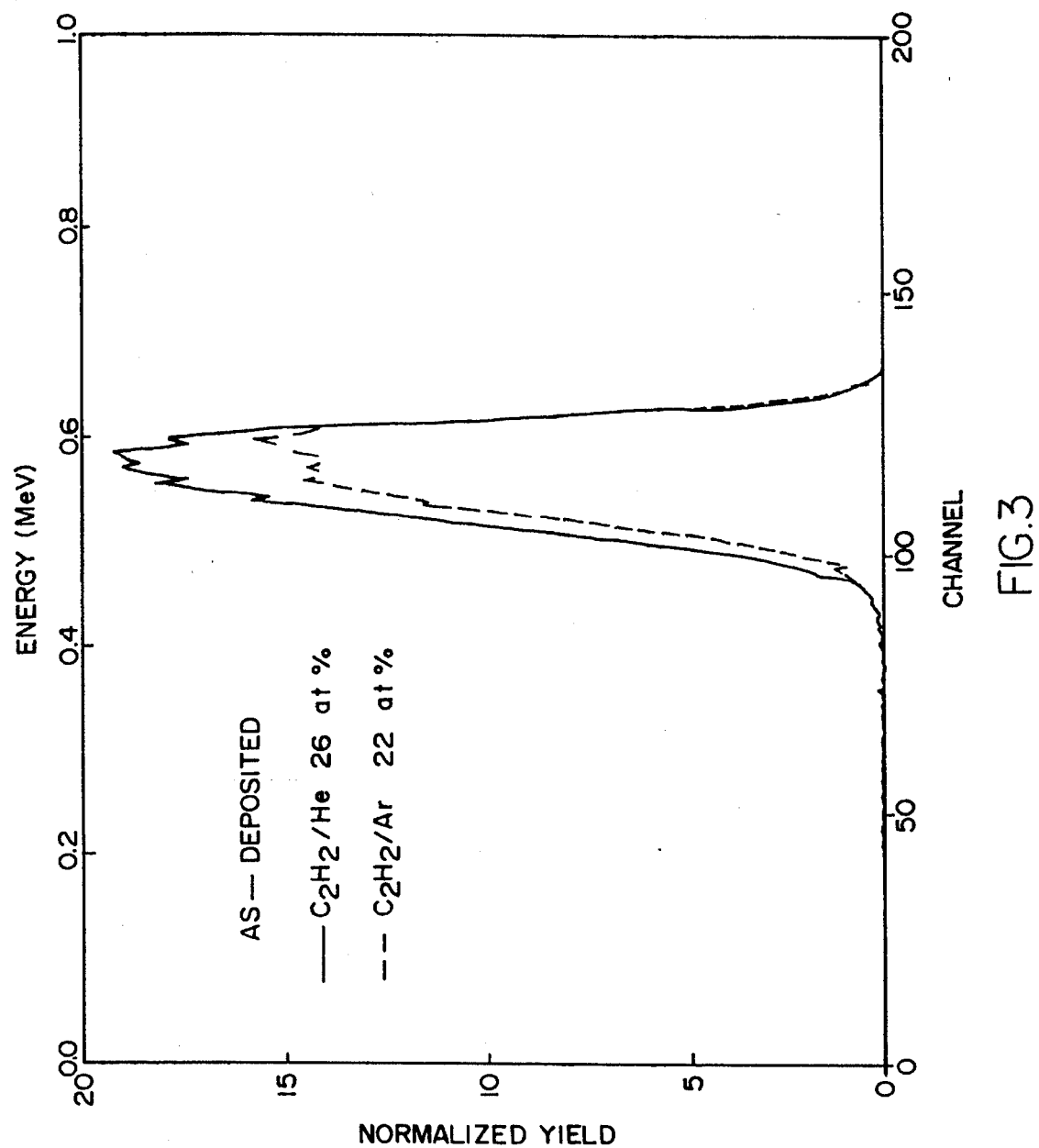
FIG. 3 shows the Forward Recoil Detection (FRD) spectra of a He- and Ar-PECVD carbon film before annealing.
Figure 4:
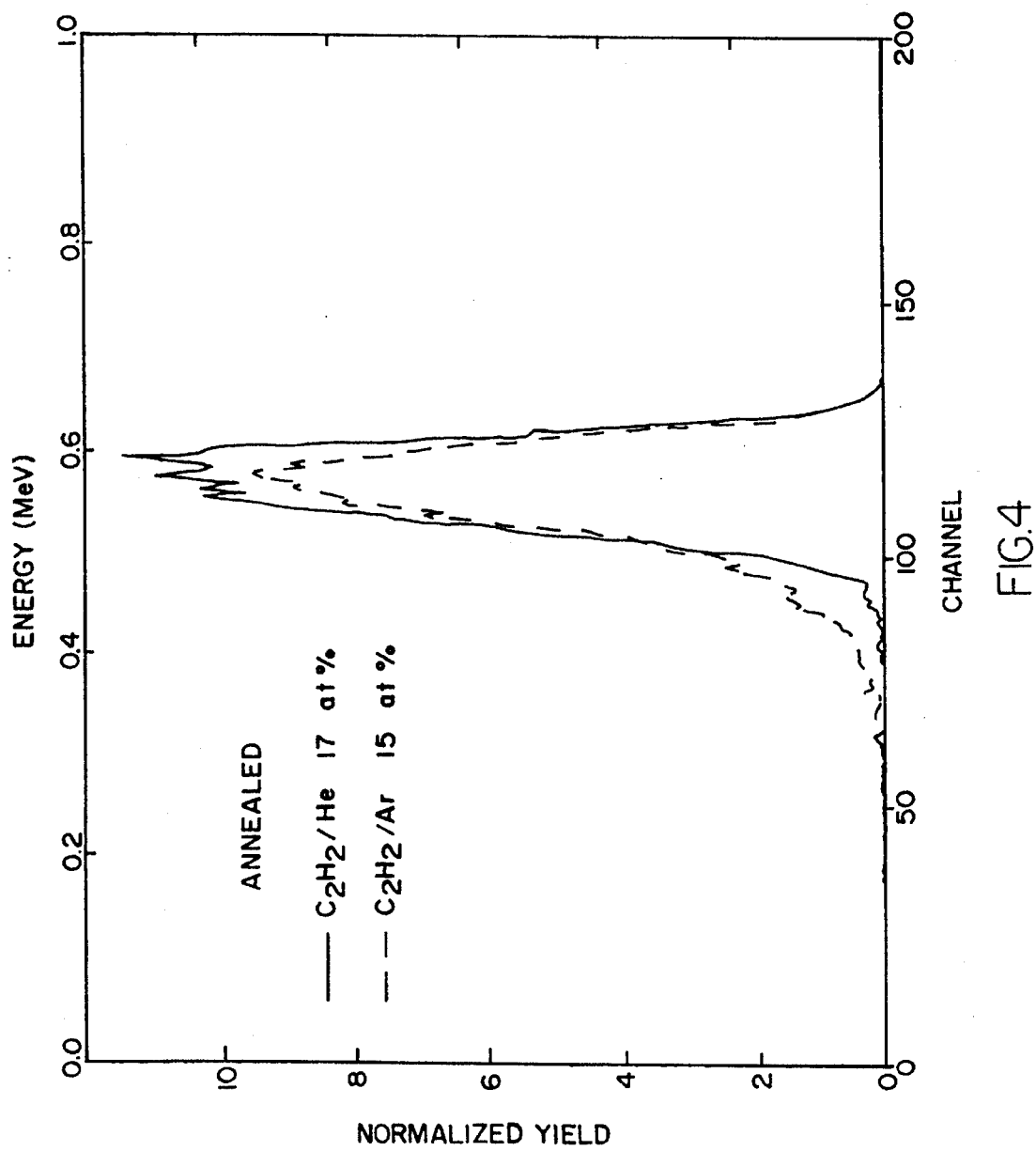
FIG. 4 shows the FRD spectra of a He- and Ar-PECVD carbon film after annealing.

FIG. 3 shows the FRD spectra of He- and Ar-PECVD carbon films The H content is 26 and 22 at. %, respectively. These numbers are measured by comparison to a known calibrated reference. FIG. 4 shows the same spectra after annealing at about 590° C. for 3 hrs in Ar/$H_2$ ambient. The H content decreased to 17 and 15 at. %. The Ar-PECVD film became hazy and soft. A roughening of the film may explain the peak asymmetry i.e. the tail, in the spectra of the annealed sample. The He-PECVD sample also lost H but the film was still hard (i.e., it could not be scratched by a razor blade). Since both the Ar- and He-PECVD films lost approximately the same amount of H, the stability can not be attributed only to the H content. H is likely to be in an unbound form for the Ar-PECVD film. Annealing at 590° C. of the Ar-PECVD films showed only $sp^2$ coordination by infrared spectroscopy. The better thermal stability of films prepared in $C_2H_2$/He mixture indicates that the He may play a major role in stabilizing the $sp^3$ coordination. Thus, as mentioned previously herein, thermal stability appears to be due to the properties of plasma excited He.

Also Rutherford back-scattering showed that Ar (5 at. %) was incorporated into the film and this may contribute to instability at high temperatures.

In summary, it has been shown that the thermal stability of a PECVD amorphous carbon film can be greatly enhanced by diluting hydrocarbon gases in He rather than Ar. An amorphous carbon film deposited by PECVD of $C_2H_2$/He preserved its hardness after annealing at 590° C. This stability appears to be related to a better film nucleation which helps to stabilize the $sp^3$ tetrahedral coordination, rather than to the H content.

EXAMPLE II

The following example illustrates the electrical properties on the diamond-like carbon films formed by PECVD from an acetylene/helium gas mixture. The two materials employed in this example comprise an Al/amorphous carbon/Cr and Al/amorphous carbon/Si. The amorphous diamond-like carbon film was deposited onto the Cr and Si substrate in accordance with the procedure of Example I. The electrical properties of the coated substrates were determined by electron-beam evaporation of Al dots having an area=$5.5 \times 10^{-4}$ $cm^{-2}$ through a metal mask. A capacitance-voltage (C-V) measurement at 1 MHz of the Al/amorphous carbon/Cr structure gave a dielectric constant $\epsilon=6.0\pm0.1$ for the amorphous carbon. This value compares well with $\epsilon=5.7$ reported for diamond (see: S.M., Sze, Physics of Semiconductor Devices, 2nd Cd. (Wiley, N.Y. 1981), Appendix G, p. 849).

Figure 5A:
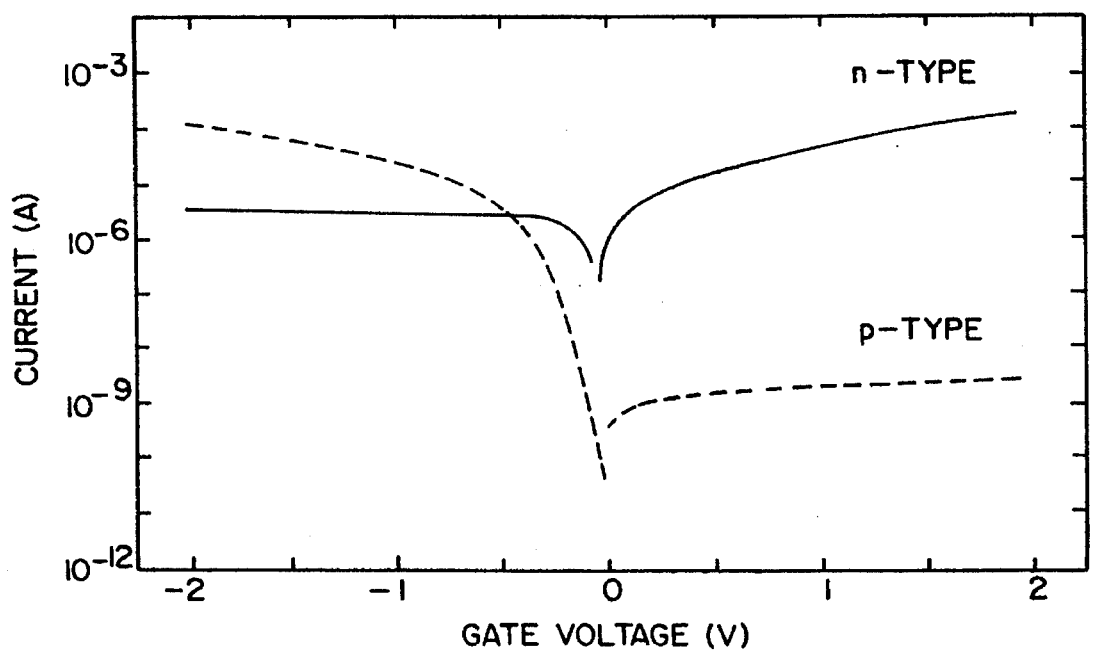
Figure 5B:
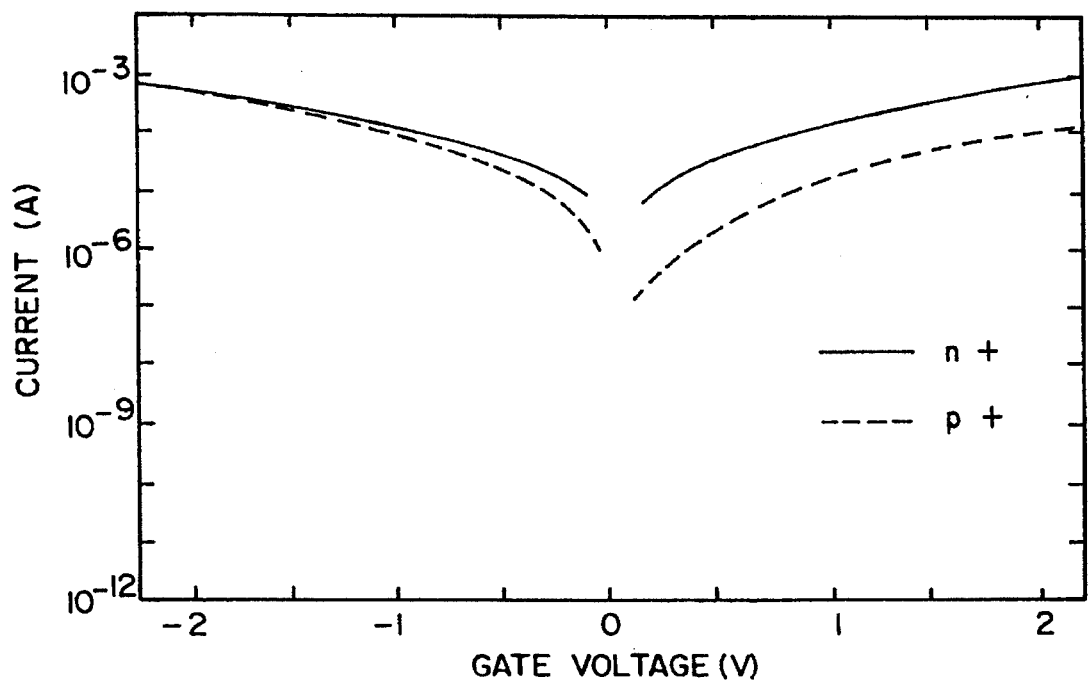

The I–V characteristics of the coated Al/Si structure for four different Si doping concentrations are shown in FIGS. 5(a) and (b) wherein FIG. 5(a) represents an $n^-$ and $p^-$ type Si heterojunction and FIG. 5(b) represents an $n^+$ and $p^+$ type Si heterojunction. The silicon doping was $\approx 10^{15} cm^{-3}$ for $n^-$ and $p^-$ and $10^{19} cm^{-3}$ for $n^+$ and $p^+$. Note that the I–V characteristics have a strong dependence on the Si substrate doping and therefore they can be attributed to the amorphous carbon/Si heterojunction and not to the metal/carbon interface. FIG. 5b shows the I–V curves at high Si doping. In this case the Fermi level moves closer to the band edges and conditions at the heterojunction are enhanced by tunnelling. This lowers the specific contact resistance of the amorphous carbon/Si interface. Thus, a rough estimate of the film resistivity can be obtained by measuring the series resistance associated with the amorphous carbon/Si($n^+$) heterostructure. This gives $\rho \approx 10^5 \Omega$.cm which appears to be close to the intrinsic resistivity of Si $\rho = 2.3 \times 10^5 \Omega$.cm.

FIG. 5a shows that the barrier heights for the amorphous diamond-like carbon film to n− and p− type Si are different. The p− type material gives a barrier height 0.2 eV higher than n− type. This difference can be measured by comparing the reverse bias saturation currents for the n and p materials assuming that the current density is, J, J∝exp($-\phi_b/kT$)× [exp(qV/kT)−1] where $\phi_b$ is the barrier at the junction, k is the Boltzmann constant, T is the temperature, q is the charge and V is the applied voltage. Since the doping levels in the n- and p-type Si samples are about the same, the band-edge Fermi level energy differences are also about the same. Also, the optical bandgap from absorption measurements is 1.1 eV for the amorphous carbon film which roughly matches the Si bandgap of 1.12 eV (at room temperature). Therefore the 0.2 eV difference can be attributed to an offset between the amorphous carbon film and the Si energy band edge; specifically, the electron affinity of the amorphous carbon film is less than that of Si by a few tenths of an eV. This would explain the higher barrier observed for the p– type heterostructure when compared to the n– type.

Figure 6B:
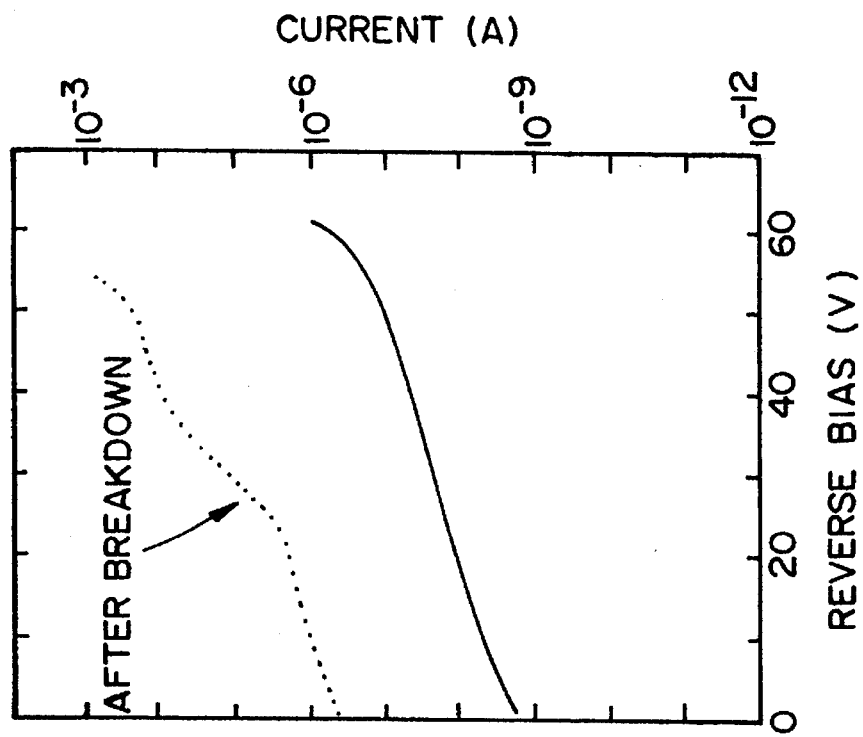
FIGS. 6(a) and 6(b) demonstrate the I–V characteristics of a thin 32 nm amorphous carbon/Si ($p^-$) heterojunction wherein the reverse bias characteristics are shown (a) before and (b) after breakdown.
Figure 6A:
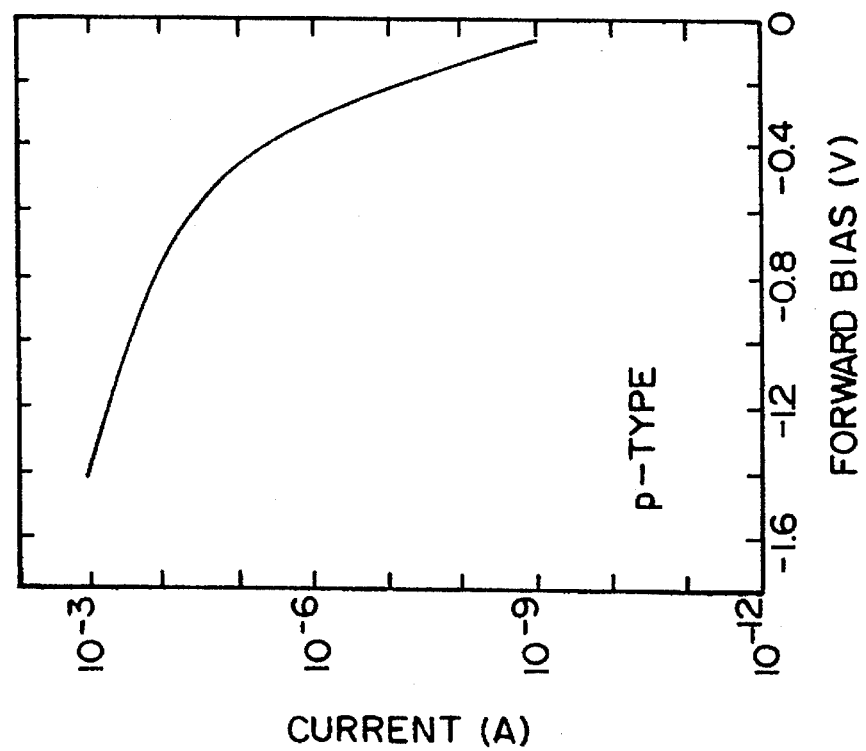

FIGS. 6(a) and (b) show the I–V characteristic for a heterojunction with a very thin 32 nm amorphous diamond-like carbon film. The silicon is p– type. Under reverse bias, breakdown occurs at 60 V or 19 MV/cm. After breakdown the reverse leakage current increases by approximately two orders of magnitude. The same effect was observed for heterojunctions with a 100 nm film thickness. This implies that breakdown occurs at the junction rather than in the carbon film since no film thickness dependence was observed. Thus, only a very high junction breakdown was obtained under reverse bias. This indicates that the amorphous carbon film breakdown is also very close to the diamond breakdown of approximately 10 MV/cm.

EXAMPLE III

The following example illustrates one important application for the diamond-like carbon films formed by PECVD from acetylene/helium plasma. More specifically, the example shows that the diamond-like carbon films of the present invention may be successfully used as a protective coating for PMMA plastic lenses. Plastic lenses made for PMMA are usually soft and easy to scratch thus protective coating for the lenses is highly desirable. Scratch resistant coating which can also provide UV protection are available in the art however these coating are not hard enough and do not provide sufficient shielding form the brightness of the sun.

The plastic lens was first cleaned with an isopropyl alcohol solution and then loaded into the reactor chamber. Thereafter, the lens was sputter cleaned in Ar at 600 V, 5 m Torr, for 5 min. This sputter cleaning process was conducted to assure good adhesion of the diamond-like carbon film onto the lens. The PECVD carbon film was deposited in accordance with the procedure described in Example I, however, the temperature of the substrate was kept at 25° C. to prevent high temperature deterioration of the lens properties.

Figure 7A:
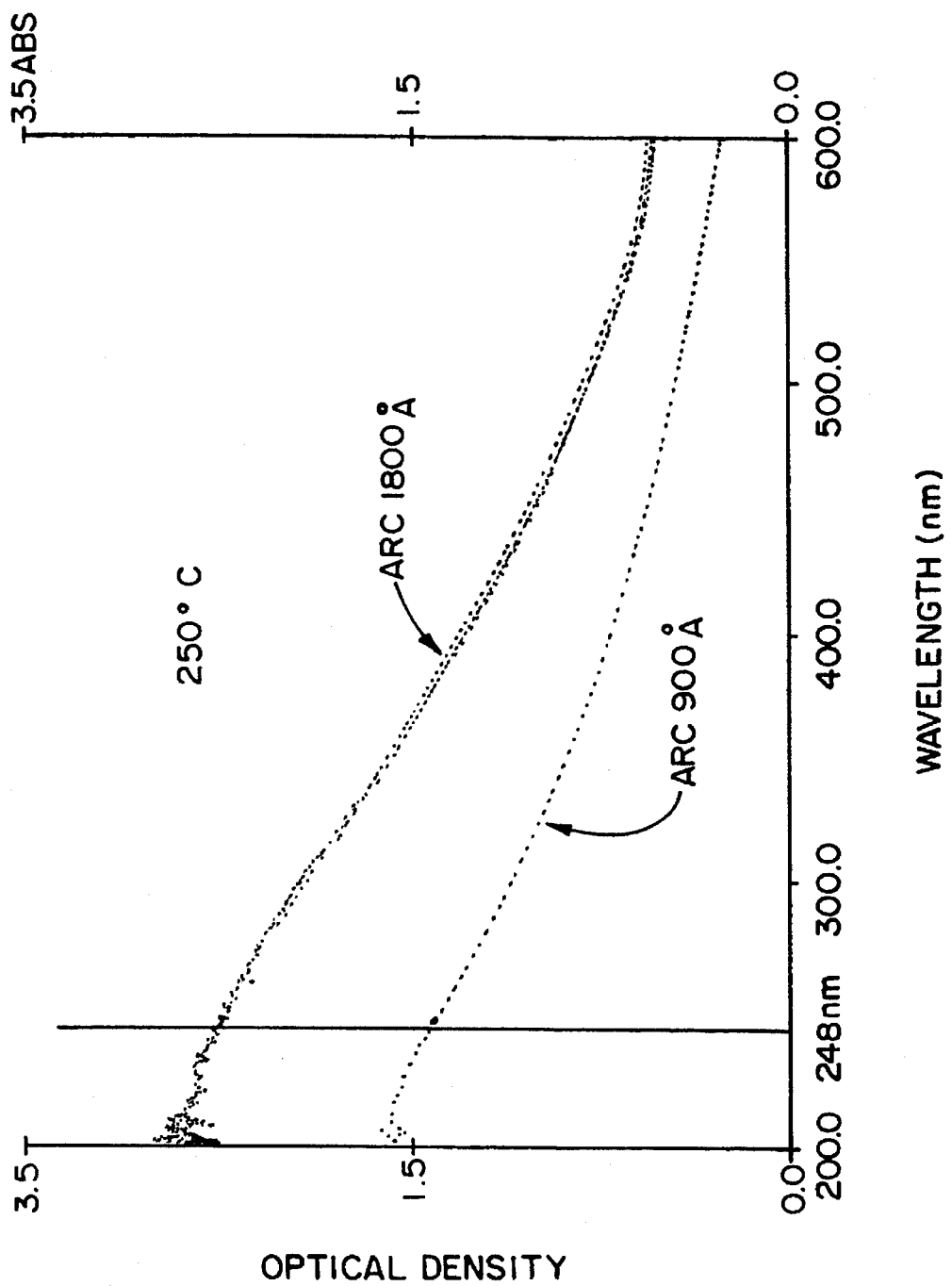
FIGS. 7(a) and 7(b) are two graphs showing the optical density vs. the wavelength for two quartz samples which were coated with a diamond-like carbon film by PECVD from acetylene/helium plasma wherein in FIG. 7(a) the dotted line (---) represents deposition at 250° C., and in FIG. 7(b) the solid line (—) represents deposition at room temperature (RT).
Figure 7B:
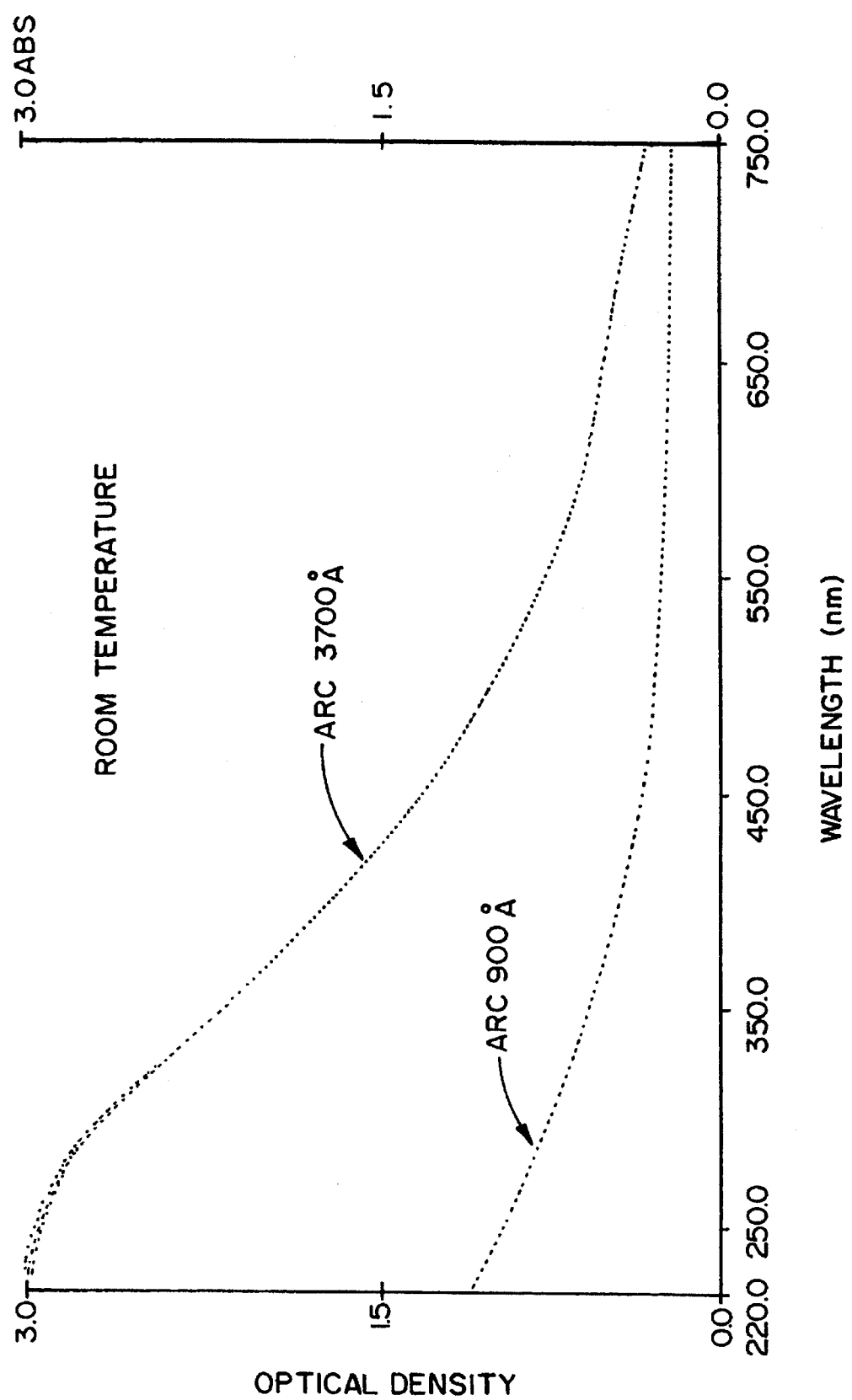

In this particular experiment a film having a thickness of 90 nm was deposited. The resultant film is amber in color and provides UV protection and shielding from the sun brightness. Furthermore, the film provides improved scratch-resistant protection for the lens as determined by rubbing steel wool on it. FIG. 7(a) and (b) show the optical densities as a function of wavelength for two carbon coatings on quartz deposited at room temperature. Both films are hard, have an amber color and are transparent in the visible region of the electromagnetic spectrum. Note that thicker coatings give higher UV protection with optical densities >2.

EXAMPLE IV

The following example illustrates the use of the amorphous diamond-like carbon film as an anti-reflective coating (ARC) for memory chip fabrication. In this example, the diamond-like carbon film was deposited onto the memory chip in accordance with the process described in Example I. A memory chip containing no ARC and one containing a spin-on ARC coating were also prepared for comparison. FIGS. 8(a)–8(c) illustrate the differences between patterning with (a) no ARC, (b) a spin-on ARC and (c) an amorphous diamond-like carbon film. Clearly by depositing the diamond-like carbon film onto the substrate in accordance with the process of the present invention, an improvement in the patterning of the single layer resist is obtained. In other words, the photoresist profile is not damaged by using the films of the present invention. This is observed in FIG. 8(c) wherein the photoresist edge profile represented by the verticle lines in the figure are more clearly defined than the photoresist edge profiles of either FIGS. 8(a) or 8(b). The line width of the photoresist edge profile in FIG. 8(c) is 0.35 µm.

While the invention has been particularly shown and described with respect to preferred embodiment thereof, it will be understood by those skilled in the art that the foregoing and other changes in form and details may be made therein without departing from the spirit and scope of the invention.

Having thus described our invention, what we claim as new, and desire to secure by Letters Patent is:

1. A coated substrate produced by depositing a diamond-like carbon film onto a substrate by plasma-enhanced chemical vapor deposition which comprises the steps of (a) admixing a hydrocarbon gas and helium to provide a gas mixture; (b) providing a plasma chamber containing a substrate; and (c) introducing said gas mixture into said plasma chamber wherein a diamond-like carbon film is dispositied on said substrate, said diamond-like carbon film having an optical density in the range from about 1 to about 3 at a wavelength of from about 200 nm to about 365 nm and is thermally stable at temperatures of about 590° C.

2. The coated substrate of claim 1 wherein the diamond-like carbon film is a deep ultraviolet inhibiting antireflective coating.

3. The coated substrate of claim 1 wherein the substrate is quartz and the diamond-like carbon film is patterned by oxygen reactive ion etching to form a patterned layer for use as an attenuated phase shift mask.

4. A coated substrate produced by depositing a diamond-like carbon film onto a substrate utilizing a plasma-enhanced chemical vapor deposition process which comprises the steps of (a) admixing acetylene and helium to form a gas mixture; (b) providing a plasma chamber containing a substrate; and (c) introducing said acetylene/helium gas mixture into said chamber wherein a diamond-like carbon film is deposited on said substrate, said diamond-like carbon film having an optical density in the range from about 1 to about 3 at a wavelength from about 200 run to about 365 nm and is thermally stable at temperature of about 590° C.

5. A structure comprising:

(a) a transparent substrate having a surface; and (b) a layer of carbon on said surface wherein said layer of carbon contains hydrogen, has an optical density in the range from about 1 to about 3 at a wavelength from about 200 nm to about 365 nm and is thermally stable temperatures of about 590° C.

6. The coated substrate of claim 1 wherein the diamond-like carbon film has an optical density of from 1 to about 3 at a wavelength of 248 nm.

7. The coated substrate of claim 6 wherein the diamond-like carbon film having an optical density of 2.3.

\* \* \* \* \*

UNITED STATES PATENT AND TRADEMARK OFFICE
CERTIFICATE OF CORRECTION

PATENT NO. : 5,470,661
DATED : November 28, 1995
INVENTOR(S) : Fredric D. Bailey, et al.

It is certified that error appears in the above-indentified patent and that said Letters Patent is hereby corrected as shown below:

On the Title Page, Section [56], Column 2, line 14: delete second occurrence of "Selective nucleation and growth of dimaond particles by plasma-assisted chemical".

In the Abstract, line 5: after "diamond" insert -- - --
Column 1, line 44: after "film" insert --.--
Column 3, line 1: delete "lie" and insert --He--
Column 4, line 18: "(——)" should read --(---)--
Column 7, line 50: "At" should read --Ar--
Column 9, line 54: after "films" insert --.--
Column 12, line 50, Claim 4: "run" should read --nm--
Column 12, line 58, Claim 5: after "stable" insert --at--
Column 12, line 63, Claim 7: "having" should read --has--

Signed and Sealed this

Sixth Day of August, 1996

Attest:

BRUCE LEHMAN

*Attesting Officer*  *Commissioner of Patents and Trademarks*